United States Patent
Hirayama et al.

(10) Patent No.: US 8,642,250 B2
(45) Date of Patent: Feb. 4, 2014

(54) OPTICAL WAVEGUIDE USING A RESIN COMPOSITION AND PRODUCTION METHOD OF THE OPTICAL WAVEGUIDE

(75) Inventors: Tomoyuki Hirayama, Ibaraki (JP); Junichi Fujisawa, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 121 days.

(21) Appl. No.: 13/296,577

(22) Filed: Nov. 15, 2011

(65) Prior Publication Data
US 2012/0155819 A1 Jun. 21, 2012

(30) Foreign Application Priority Data
Dec. 20, 2010 (JP) .................. 2010-283669

(51) Int. Cl.
*G02B 6/122* (2006.01)
*G03F 7/038* (2006.01)
*G02B 6/138* (2006.01)

(52) U.S. Cl.
CPC .............. *G03F 7/038* (2013.01); *G03F 7/0385* (2013.01); *G03F 7/0388* (2013.01); *G02B 6/122* (2013.01); *G02B 6/138* (2013.01); *G02B 6/1221* (2013.01)
USPC .......................................... 430/321; 430/320

(58) Field of Classification Search
None
See application file for complete search history.

(56) References Cited

U.S. PATENT DOCUMENTS

| | | | | |
|---|---|---|---|---|
| 7,394,965 B2 * | 7/2008 | Utaka et al. | .......... | 385/141 |
| 2004/0149382 A1 * | 8/2004 | Giza et al. | ............ | 156/327 |

FOREIGN PATENT DOCUMENTS

| | | | |
|---|---|---|---|
| JP | 5-264811 A | | 10/1993 |
| JP | 2000-169553 | * | 6/2000 |
| JP | 2002-145984 | * | 5/2002 |
| JP | 2007-164011 | * | 6/2007 |
| JP | 2009-175456 A | | 8/2009 |
| JP | 2009-175457 A | | 8/2009 |
| JP | 2009-269954 | * | 11/2009 |
| JP | 2010-91733 A | | 4/2010 |

OTHER PUBLICATIONS

Kagawa webpage (6 pages in Japanese and 7 pages in English (13 total), public disclosure in 2005).*
Japanese Office Action dated Mar. 19, 2013, issued in corresponding Japanese Patent Application No. 2010-283669, w/ English translation.

* cited by examiner

*Primary Examiner* — Martin Angebranndt
(74) *Attorney, Agent, or Firm* — Westerman, Hatton, Daniels & Adrian, LLP

(57) ABSTRACT

A resin composition for an optical waveguide is provided, which has excellent adhesiveness to a cladding layer of the optical waveguide and excellent patternability for formation of a core portion of the optical waveguide and reduces the optical waveguide loss. An optical waveguide produced by using the resin composition is also provided. The resin composition comprises: (A) a multifunctional partially-acrylated epoxy resin, as a major component, having an epoxy group and a (meth)acrylate group in the same main chain thereof; and (B) a photopolymerization initiator as a curing component. The optical waveguide includes: a substrate; a cladding layer provided on the substrate; and a core portion provided on the cladding layer for transmission of an optical signal; wherein the core portion is formed from the resin composition.

5 Claims, No Drawings

OPTICAL WAVEGUIDE USING A RESIN COMPOSITION AND PRODUCTION METHOD OF THE OPTICAL WAVEGUIDE

BACKGROUND OF THE INVENTION

1. Field of the Invention

The present invention relates to a resin composition to be used as a material for a core portion of an optical waveguide, an optical waveguide produced by using the resin composition, and a production method of the optical waveguide.

2. Description of the Related Art

Optical waveguides are typically incorporated in optical devices such as optical waveguide devices, optical integrated circuits and optical wiring boards to be widely used for optical communications, optical information processing and other general optics. Such an optical waveguide typically includes core portions of a predetermined pattern provided as light paths, and an under-cladding layer and an over-cladding layer covering the core portions.

A roll-to-roll process, for example, is conceivably employed for production of the optical waveguide. Where an epoxy-based optical waveguide material (varnish) is used as a core material in the roll-to-roll process, for example, the varnish is applied onto a base film and then dried, whereby a double-layer film including an uncured core formation film layer is formed. When the double-layer film is used, the uncured core formation film layer obtained by the application and the drying of the varnish should satisfy the following property requirements for adaptation to the roll-to-roll process: (1) the uncured film layer is free from tackiness (or is tack-free) so as to be prevented from being transferred onto a roll of the double-layer film and from suffering from surface roughness; and (2) the film layer has flexibility so as to be prevented from being cracked due to a stress caused by warpage thereof during transportation of the roll of the double-layer film. Therefore, the material for the core formation film layer is required to contain no liquid component, but is required to contain a solid resin as a polymer component having a relatively high molecular weight to satisfy the property requirement (1).

In view of this, a solid epoxy resin, for example, is used as the solid resin. In order to cure the solid epoxy resin with excellent patternability through photo-cationic polymerization, a multifunctional epoxy resin having an epoxy group is used for improvement of curing sensitivity. However, the mobility of reactive species generated from a photoacid generator (PAG) blended with the solid epoxy resin is absolutely reduced as compared with a case in which a liquid epoxy resin is used. Therefore, the amount of the photoacid generator (PAG) required to be used for formation of a fine pattern of core portions arranged at a smaller pitch is inevitably increased as compared with the case in which the liquid epoxy resin is used. It is known that the photoacid generator (PAG) typically causes coloration (yellowing) of a product obtained by curing the resin. As a result, an optical waveguide produced by using a photosensitive resin composition adapted for the roll-to-roll process suffers from a higher optical waveguide loss than an optical waveguide produced by using a photosensitive resin composition not adapted for the roll-to-roll process. Thus, there is a limitation in reducing the optical waveguide loss, because the improvement of the patternability based on the amount of the photoacid generator (PAG) is contradictory to the reduction of the optical waveguide loss when the formulation of the core formation material is designed so as to be adapted for the roll-to-roll process.

On the other hand, it is known that a photosensitive resin composition containing a (meth)acrylate resin is typically cured with the use of a photoradical polymerization initiator, and an optical waveguide produced by using the photosensitive resin composition containing the (meth)acrylate resin generally has a lower optical waveguide loss than the optical waveguide produced by using the photosensitive resin composition containing the epoxy resin. To reinforce the thermal and mechanical fragility of the optical waveguide, a mixed material system containing both the (meth)acrylate resin and the epoxy resin is generally used (see, for example, JP-A-2009-175456 and JP-A-2009-175457).

However, the mixed material system containing both the (meth)acrylate resin and the epoxy resin as disclosed in JP-A-2009-175456 and JP-A-2009-175457 is not preferred because phase separation occurs between the (meth)acrylate resin and the epoxy resin to cause internal variations in haze and refractive index.

Further, the (meth)acrylate resin material experiences greater volumetric contraction than the epoxy resin material during a curing reaction. For various types of optical waveguides including a cladding layer required to be formed at higher dimensional accuracy, it is preferred, in consideration of various process steps, to form an over-cladding layer and an under-cladding layer from the epoxy resin material. If the core portions are formed from the (meth)acrylate resin material on the under-cladding layer formed from the epoxy resin material, however, the core pattern is liable to be separated or lost during a developing step in the formation of the core pattern. This is because adhesion strength between the under-cladding layer and the core portions is lower in the absence of chemical bonds between the under-cladding layer and the core portions. Therefore, the formation of the (meth)acrylate resin core portions on the epoxy resin under-cladding layer disadvantageously reduces the productivity.

In current technology for the production of the optical waveguide, there is an eager demand for an optical waveguide core material which is excellent in transparency as well as adhesion to the epoxy resin under-cladding layer, patternability and tack-free property for the adaptation to the roll-to-roll process, and reduces the optical waveguide loss.

SUMMARY OF THE INVENTION

A resin composition is provided which has excellent adhesiveness to a cladding layer of an optical waveguide, excellent patternability for formation of cores of the optical waveguide and tack-free property and reduces the optical waveguide loss. Also provided is an optical waveguide produced by using the resin composition and a production method of the optical waveguide.

According to a first aspect, there is provided a resin composition for an optical waveguide, the resin composition comprising:

(A) a multifunctional partially-acrylated epoxy resin, as a major component, having an epoxy group and a (meth)acrylate group in the same main chain thereof; and (B) a photopolymerization initiator as a curing component.

According to a second aspect, there is provided an optical waveguide, which comprises: a substrate; a cladding layer provided on the substrate and including an under-cladding layer and an over-cladding layer; and a core portion provided in the cladding layer for transmission of an optical signal; wherein the core portion is formed from the resin composition according to the first aspect.

According to a third aspect, there is provided a production method for producing an optical waveguide including a substrate, a cladding layer provided on the substrate, and a core portion provided on the cladding layer for transmission of an optical signal, the method comprising the steps of: forming the cladding layer on the substrate; and forming the core portion from the resin composition according to the first aspect on the cladding layer.

A core material is provided which is excellent in adhesiveness to an epoxy resin material for the cladding layer of the optical waveguide and reduces the optical waveguide loss. The multifunctional partially-acrylated epoxy resin having an epoxy group and a (meth)acrylate group in the same main chain there of is employed. The resin composition containing the multifunctional partially-acrylated epoxy resin has excellent adhesiveness to the epoxy resin material and highly accurate patternability which is a characteristic property of the (meth)acryl material to provide a highly reliable optical waveguide.

The core material satisfies the requirements for the higher transparency and the excellent patternability on the epoxy resin under-cladding layer. This is supposedly because the resin material having a multifunctional skeleton including both the (meth)acrylate group and the epoxy group for use as the core material:
(1) can be evenly cured without phase separation which may otherwise cause internal variations in refractive index; and
(2) provides separate curing reaction mechanisms for curing the core material through radical polymerization of the (meth)acrylate group for the patterning and for curing the core material through cationic polymerization of the epoxy group for adhesion between the core portion and the cladding layer (under-cladding layer) through a chemical reaction, whereby the amount of the photoacid generator (PAG) required for the formation of the core pattern is reduced.

The core pattern can be formed from the acrylate material on the epoxy resin cladding layer without separation. This is supposedly because the epoxy group present together with the (meth)acrylate group in the specific resin (core material) is polymerized with an epoxy residue present on the surface of the under-cladding layer for improvement of the adhesion between the core portion and the under-cladding layer.

The resin composition for the optical waveguide comprises the multifunctional partially-acrylated epoxy resin (A), as the major component, having the epoxy group and the (meth)acrylate group in the same main chain thereof, and the photopolymerization initiator (B) as the curing component. The core portion of the optical waveguide is formed from the resin composition. Therefore, the core portion is highly transparent and substantially free from the coloration (yellowing). The core pattern can be accurately formed on the epoxy resin cladding layer with excellent patternability and excellent adhesion without separation. As a result, the optical waveguide is highly reliable with a lower loss.

Where epoxy groups and (meth)acrylate groups are present as photosensitive substituent groups in a number ratio of 40:60 to 60:40 based on a total number of 100 in the multifunctional partially-acrylated epoxy resin (A), the resin composition is free from insufficient curing, and is further improved in adhesiveness.

Where the photopolymerization initiator (B) comprises a photoradical polymerization initiator and a photoacid generator, it is possible to reduce the amount of the photoacid generator, which may otherwise cause coloration (yellowing), without deterioration in curability.

Where the photopolymerization initiator (B) is present in a proportion of 1 to 30 wt % based on the solid weight of the resin composition (excluding a solvent), the resin composition has higher transparency, excellent patternability and further excellent adhesion to the epoxy resin cladding layer.

Where the resin composition is used as the core material for the production of the optical waveguide and the step of forming the cladding layer on the substrate and the step of forming the core portion on the cladding layer are continuously performed through a roll-to-roll process by paying out a substrate web from a roll and rewinding the substrate web after completion of these steps, the core portion thus formed is free from tackiness and is imparted with flexibility. Therefore, the optical waveguide can be efficiently produced as having higher reliability without any problem in the production process.

DETAILED DESCRIPTION OF THE INVENTION

Embodiments of the present invention will hereinafter be described.

<<Resin Composition for Optical Waveguide>>

A resin composition for an optical waveguide is prepared by using a multifunctional partially-acrylated epoxy resin (A) having a specific structural unit as a major component and a photopolymerization initiator (B).

The multifunctional partially-acrylated epoxy resin (A) having the specific structural unit has an epoxy group and a (meth)acrylate group in the same main chain thereof. A feature is to use the specific multifunctional epoxy resin having the epoxy group and the (meth)acrylate group as functional groups (photosensitive substituent groups) in the same main chain thereof.

An example of the multifunctional partially-acrylated epoxy resin (A) having the epoxy group and the (meth)acrylate group in the same main chain thereof is a multifunctional partially-acrylated epoxy resin having a structural unit represented by the following general formula (1):

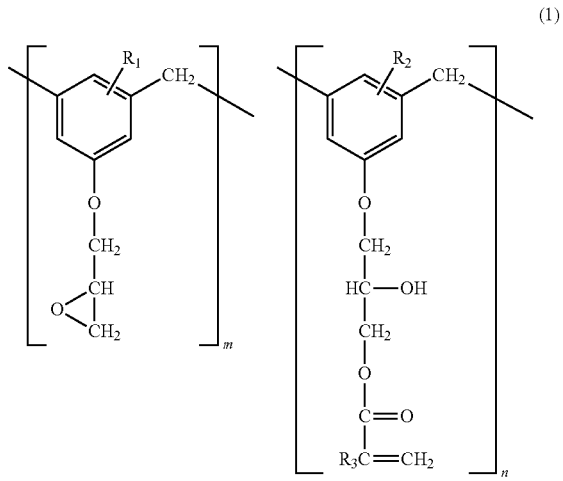

(1)

wherein $R_1$ and $R_2$, which may be the same or different, are each a hydrogen atom or a methyl group; $R_3$ is a hydrogen atom or a methyl group; and $m+n=1$, $m>0$ and $n>0$.

It is particularly preferred that $R_1$ and $R_2$ are each a methyl group and $R_3$ is a hydrogen atom in the above general formula (1). In the structural unit represented by the above general formula (1), the repeating units m, n may be polymerized through any of block polymerization, alternating polymerization and random polymerization, but particularly preferably through the block polymerization. The (meth)acrylate group means an acrylate group or a methacrylate group.

In the multifunctional partially-acrylated epoxy resin having the structural unit represented by the above general formula (1), the epoxy groups and the (meth)acrylate groups (photosensitive substituent groups) are preferably present in a number ratio of 40:60 to 60:40, particularly preferably 50:50, based on a total number of 100. Where the number ratio between the epoxy groups and the (meth)acrylate groups is in the aforementioned range, the resulting resin composition is free from insufficient curing and has further excellent adhesiveness. If the number of the epoxy groups is excessively great, it is difficult to sufficiently cure the resulting resin composition, leading to poorer patternability in formation of a core portion. If the number of the epoxy groups is excessively small, a core portion formed from the resulting resin composition is poorer in adhesiveness.

Specific examples of the multifunctional partially-acrylated epoxy resin having the structural unit represented by the above general formula (1) are ENA materials available from Kagawa Chemical Co., Ltd.

The multifunctional partially-acrylated epoxy resin (A) having the above specific structural unit can be produced, for example, through partial acrylation of a multifunctional epoxy resin.

The multifunctional epoxy resin may be selected from various multifunctional epoxy resins, including multifunctional epoxy resins of cresol novolak type, phenol novolak type and various other types. Specific examples of the multifunctional epoxy resins of the cresol novolak type include YDCN series available from Tohto Kasei Co., Ltd, EOCN series available from Nippon Kayaku Co., Ltd, EPICRON N-6XX series available from DIC Corporation. Specific examples of the multifunctional epoxy resins of the phenol novolak type include YDPN series available from Tohto Kasei Co., Ltd, EPPN series available from Nippon Kayaku Co., Ltd, EPICRON N-7XX series available from DIC Corporation, and JER's 152, 154. Other examples of the specific multifunctional epoxy resin include JER's 157S70, 157S65, 1031S and 1032H60.

Any epoxy resins each having the epoxy group and the (meth)acrylate group in the same main chain thereof may be used either along or in combination as the multifunctional partially-acrylated epoxy resin (A) having the specific structural unit.

Where the multifunctional partially-acrylated epoxy resin (A) is used for an optical waveguide, the photopolymerization initiator (B) is used to impart the resin composition with curability by irradiation with radiation.

Usable as the photopolymerization initiator (B) are a photoradical polymerization initiator and a photoacid generator, which may be used either alone or in combination. It is particularly preferred to use the photoradical polymerization initiator and the photoacid generator in combination, because the amount of the photoacid generator which may cause coloration (yellowing) can be reduced.

Examples of the photoradical polymerization initiator include photopolymerization initiators such as benzoins, benzoin alkyl ethers, acetophenones, aminoacetophenones, anthraquinones, thioxanthenes, ketals, benzophenones, xanthones and phosphine oxides. Specific examples of the photoradical polymerization initiators include IRGACURE 651, IRGACURE 184, IRGACURE 1173, IRGACURE 500, IRGACURE 2959, IRGACURE 127, IRGACURE 754, IRGACURE MBF, IRGACURE 907, IRGACURE 369, IRGACURE 379, IRGACURE 819, IRGACURE 1800, DAROCURE TPO, DAROCURE 4265, IRGACURE OXE01, IRGACURE OXE02, IRGACURE 250 and DAROCURE EHA. These photoradical polymerization initiators may be used either alone or in combination.

The photoacid generator is used for imparting the resin composition with UV curability. Examples of the photoacid generator include aromatic diazonium salts, aromatic sulfonium salts, aromatic iodonium salts, aromatic sulfoxonium salts, metallocene compounds and iron arene compounds. Among these photoacid generators, the aromatic sulfonium salts are preferred for photo-curability and adhesiveness. Specific examples of the photoacid generators include CPI-200K, CPI-100P, CPI-101A and CPI-210S available from San-Apro Ltd. These photoacid generators may be used either alone or in combination.

Where the photoradical polymerization initiator and the photoacid generator are used in combination, the mixing weight ratio between the photoradical polymerization initiator and the photoacid generator is preferably 0.5/0.5 to 20/10, particularly preferably 1/1 to 10/5.

In the resin composition, the photoradical polymerization initiator is preferably present in a proportion of 0.5 to 20 parts by weight, particularly preferably 1 to 10 parts by weight, based on 100 parts by weight of the multifunctional partially-acrylated epoxy resin (A). In the resin composition, the photoacid generator is preferably present in a proportion of 0.5 to 10 parts by weight, particularly preferably 1 to 5 parts by weight, based on 100 parts by weight of the multifunctional partially-acrylated epoxy resin (A).

In the resin composition, the photopolymerization initiator (B) is preferably present in a proportion of 1 to 30 wt %, particularly preferably 2 to 15 parts by weight, based on the solid weight of the resin composition (excluding a solvent). If the proportion is excessively small, it is difficult to ensure sufficient photo-curability. If the proportion is excessively great, it is impossible to provide a proper core pattern configuration.

In addition to the components (A) and (B), as required, the resin composition for the optical waveguide may contain a silane coupling agent or a titanium coupling agent for improvement of adhesiveness, an olefin oligomer, a cycloolefin oligomer or polymer such as a norbornene oligomer, a flexibility imparting compound such as a synthetic rubber or a silicone compound, an acid proliferator, an antioxidant, a leveling agent, a defoaming agent, or other additive. Any of these additives may be blended in the resin composition, as long as the effects are not impaired.

<<Production of Optical Waveguide>>

Next, an optical waveguide produced by using the resin composition for formation of core portions thereof will be described.

The optical waveguide includes, for example, a substrate, a cladding layer (under-cladding layer) provided on the substrate, and core portions provided in a predetermined pattern on the cladding layer for transmission of optical signals. The core portions of the optical waveguide are formed from the resin composition which contains the epoxy-acrylate resin (A) having the above specific structural unit and the photopolymerization initiator (B). In the optical waveguide, the cladding layer is required to have a lower refractive index than the core portions.

The optical waveguide can be produced through the following process steps. First, the substrate is prepared, and then a photosensitive resin composition (varnish) as a cladding layer material is applied onto the substrate. The applied photosensitive resin composition is irradiated with ultraviolet radiation or the like, and then heat-treated to be cured. Thus, the cladding layer is formed.

In turn, a varnish of the resin composition for formation of the core portions is applied onto the cladding layer to form a resin composition layer. The application of the varnish is achieved, for example, by a spin coating method, a dipping method, a casting method, an injection method, an inkjet method or a roll coating method. Where the varnish is prepared by diluting the photosensitive resin composition with an organic solvent, a drying step may be performed, as required, to heat-treat the applied varnish at 50° C. to 150° C. for 1 to 30 minutes.

Subsequently, a photomask formed with a predetermined opening pattern (optical waveguide pattern) conformal to the core portions is placed on the resin composition layer. Then, portions of the resin composition layer corresponding to the opening pattern are exposed to radiation via the photomask. In the exposure, the radiation is applied to the resin composition layer perpendicularly to the resin composition layer, whereby the exposed portions are cured through a photoreaction. Thereafter, an unexposed portion of the resin composition layer is dissolved away with the use of an alkali developing liquid.

After the development with the alkali developing liquid, the core portions thus formed by patterning are rinsed with a rinse liquid for removal of salts remaining in and on the core portions. Usable as the rinse liquid are tap water, ion-exchanged water, an aqueous solution of a surface active agent, an acidic aqueous solution and an organic solvent.

Thereafter, the resulting core portions are further thermally cured through a heat treatment. The heat treatment is typically performed at 120° C. to 200° C. for 1 to 60 minutes. Thus, the core portions are formed by the patterning. The core portions typically each have a thickness of 10 to 150 μm, preferably 30 to 60 μm. The core portions typically each have a width of 8 to 70 μm, preferably 30 to 60 μm.

Thus, the intended optical waveguide is produced.

Exemplary materials for the substrate include polymer films and glass substrates. Specific examples of the polymer films include polyethylene terephthalate (PET) films, polyethylene naphthalate films and polyimide films. The substrate typically has a thickness of 10 μm to 3 mm.

Examples of the radiation to be used for the exposure include visible radiation, ultraviolet radiation, infrared radiation, X-ray, α-ray, β-ray and γ-ray. Particularly, the ultraviolet radiation is preferred, which permits irradiation with a higher energy for a higher curing rate. In addition, a device for the irradiation with the ultraviolet radiation generally has a smaller size and is less expensive, thereby reducing the production costs. Exemplary light sources for emitting the ultraviolet radiation include a low pressure mercury lamp, a high pressure mercury lamp, an ultrahigh pressure mercury lamp, a xenon lamp, a metal halide lamp, a mercury vapor arc lamp and a carbon arc lamp. The dose of the ultraviolet radiation is typically about 10 to about 10000 mJ/cm$^2$, preferably about 50 to about 5000 mJ/cm$^2$, more preferably about 500 to about 3000 mJ/cm$^2$.

After the exposure, a heat treatment is typically performed at 80° C. to 250° C. for 10 seconds to 2 hours, preferably at 100° C. to 150° C. for 5 minutes to 1 hour, for completion of the photoreaction.

As described above, the ultrahigh pressure mercury lamp or the high pressure mercury lamp is typically used for the irradiation with the radiation (ultraviolet radiation) via the photomask in the photolithography process. However, these light sources are not adapted to emit light at a single wavelength, but are adapted to emit radiation such as g-line, h-line and i-line at a plurality of wavelengths. On the other hand, it is known that the photolithography process is improved in resolution and image formation quality by irradiation with radiation having a limited wavelength range rather than by irradiation with broadband light having a plurality of wavelengths, depending on the type of the photosensitive resin. Particularly, where the broadband light is used for curing an epoxy material or an oxetane material through photo-cationic polymerization or for curing an acryl material through photoradical polymerization, a so-called "T-top phenomenon" occurs, in which a surface portion of a film of the material is preferentially cured by irradiation with the broadband light and an upper portion of a pattern has a greater width as seen in section. Due to the T-top phenomenon, the resulting optical waveguide has an uneven width, i.e., a smaller width on its lower side (on a substrate side) and a greater width on its upper side (on an outer surface side), as seen in section.

Therefore, an exposure filter called "band-pass filter" is preferably used for the irradiation with the radiation (ultraviolet radiation) via the photomask, so that only the intended exposure radiation suitable for the core material can be applied onto the core material for improvement of the resolution of the core pattern. A core pattern actually formed from some core material suffers from thickening or thinning to have dimensions deviated from the designed dimensions of the photomask due to curing shrinkage, other volumetric contraction or scattering of the radiation (ultraviolet radiation) or for other process-related reasons. Therefore, it is desirable to multiply the size of the photomask by a correction factor, so that the core pattern can be formed as having dimensions within a desired dimensional range.

Usable as the developing liquid for the removal of the unexposed portion is an organic solvent such as γ-butyrolactone or an inorganic solvent.

In the optical waveguide production process, for example, the step of forming the cladding layer on the substrate and the step of forming the core portions on the cladding layer are continuously and efficiently performed through the roll-to-roll process by paying out a substrate web from a roll and rewinding the substrate web after completion of these process steps. That is, the optical waveguide production process is adapted for the roll-to-roll process.

The substrate may be separated from the optical waveguide thus produced to provide a film-shaped optical waveguide. The film-shaped optical waveguide is further excellent in flexibility.

The optical waveguide thus produced is usable as an optical waveguide for a wiring circuit board to be provided in a hinge portion of a mobile device such as a mobile phone.

EXAMPLES

Inventive examples will be described in conjunction with comparative examples. It should be understood that the present invention be not limited to the following inventive examples.

Example 1

<Core Material (Resin Composition for Optical Waveguide)>

In a light shielded state, 100 g of a multifunctional partially-acrylated epoxy resin of cresol novolak type (Kagawa Chemical's ENA-4Y-1, which is a propylene glycol monomethyl ether acetate (PMA) solution containing 40 wt % of a resin prepared by partially acrylating a cresol novolak type multifunctional epoxy resin YDCN-700-10 available from Tohto Kasei Co., Ltd. and having an epoxy group/acrylate group number ratio of 50:50 based on a total number of photosensitive substituent groups defined as 100), 0.6 g of IRGACURE 819 (available from Ciba Japan Inc.) as a photoradical polymerization initiator and 3.0 g of IRGACURE 184 (available from Ciba Japan Inc.) were mixed together and stirred with heating at 80° C. for complete dissolution. After the resulting mixture was cooled to a room temperature (25° C.), 0.6 g of CPI-200K available from San-Apro Ltd. was added as a photoacid generator to the mixture. Thus, a photosensitive varnish (core material) was prepared.

<Formation of Uncured Film Layer>

(1) Preparation of Varnish for Under-Cladding Layer

First, 75 parts by weight of an epoxy resin (EHPE-3150 available from Daicel Chemical Industries, Ltd.), 25 parts by weight of an epoxy resin (MARPROOF G-0150 available from NOF Corporation), 5 parts by weight of a UV absorber (TINUVIN 479 available from Ciba Japan Inc.) and 4 parts by weight of a photoacid generator (CPI-200K available from San-Apro Ltd.) were added to 70 parts by weight of cyclohexanone (available from Wako Pure chemical industries, Ltd.) and the resulting mixture was stirred with heating at 80° C. for complete dissolution. Thus, a varnish for an under-cladding layer was prepared.

(2) Formation of Under-Cladding Layer

The varnish thus prepared for the under-cladding layer was applied onto a 50-μm thick SUS substrate (at 5000 rpm for 10 seconds) by means of a spin coater, and thermally dried for 3 minutes in a drying oven. Thus, an uncured under-cladding varnish layer was formed. Then, the uncured under-cladding varnish layer was exposed to B-line radiation at a wavelength of 365 nm at 1000 mJ by means of an ultraviolet radiation (UV) emitting apparatus. Thus, the under-cladding layer (photo-cured aliphatic epoxy resin film) was formed, which had a film thickness of 15 μm. A polymerization reaction of epoxy groups was allowed to proceed by utilizing heat generated during the exposure rather than by performing a heat treatment after the exposure.

Then, the photosensitive varnish (core material) was applied onto the 15-μm thick under-cladding layer (photo-cured aliphatic epoxy resin film) by means of an applicator (with an applicator gap of 125 μm), and dried at 150° C. for 3 minutes in a drying oven. Thus, an uncured film layer having a thickness of 70 to 80 μm was formed.

<Formation of Optical Waveguide Pattern>

The uncured film layer thus formed was exposed to I-line radiation at 1500 mJ via a photomask formed with a predetermined pattern, and then heated at 140° C. for 10 minutes. In turn, a developing process was performed with the use of γ-butyrolactone by means of a spray developing machine, followed by rinsing with water and drying. Thus, predetermined optical waveguide patterns (including conductor patterns each having width/pitch (L/S) of 50 μm/200 μm for evaluation of adhesiveness and optical waveguide loss, and a pattern having L/S of 20 μm/20 μm for evaluation of patternability) were produced.

Example 2

Predetermined optical waveguide patterns (including conductor patterns each having width/pitch (L/S) of 50 μm/200 μm for evaluation of adhesiveness and optical waveguide loss, and a pattern having L/S of 20 μm/20 μm for evaluation of patternability) were produced in substantially the same manner as in Example 1, except that 100 g of a multifunctional partially-acrylated epoxy resin of cresol novolak type (Kagawa Chemical's ENA-4Y-2, which is a propylene glycol monomethyl ether acetate (PMA) solution containing 40 wt % of a resin prepared by partially acrylating a cresol novolak type multifunctional epoxy resin YDCN-700-10 available from Tohto Kasei Co., Ltd. and having an epoxy group/acrylate group number ratio of 60:40 based on a total number of photosensitive substituent groups defined as 100) was used instead of the multifunctional partially-acrylated epoxy resin of cresol novolak type (Kagawa Chemical's ENA-4Y-1) of Example 1.

Example 3

Predetermined optical waveguide patterns (including conductor patterns each having width/pitch (L/S) of 50 μm/200 μm for evaluation of adhesiveness and optical waveguide loss, and a pattern having L/S of 20 μm/20 μm for evaluation of patternability) were produced in substantially the same manner as in Example 1, except that 100 g of a multifunctional partially-acrylated epoxy resin of cresol novolak type (Kagawa Chemical's ENA-4Y-3, which is a propylene glycol monomethyl ether acetate (PMA) solution containing 40 wt % of a resin prepared by partially acrylating a cresol novolak type multifunctional epoxy resin YDCN-700-10 available from Tohto Kasei Co., Ltd. and having an epoxy group/acrylate group number ratio of 40:60 based on a total number of photosensitive substituent groups defined as 100) was used instead of the multifunctional partially-acrylated epoxy resin of cresol novolak type (Kagawa Chemical's ENA-4Y-1) of Example 1.

Comparative Example 1

Predetermined optical waveguide patterns (including conductor patterns each having width/pitch (L/S) of 50 μm/200 μm for evaluation of adhesiveness and optical waveguide loss, and a pattern having L/S of 20 μm/20 μm for evaluation of patternability) were produced in substantially the same manner as in Example 1, except that a mixture solution (having a total weight of 100 g and containing epoxy groups as photosensitive substituent groups) prepared by dissolving 51 g of a cresol novolak type multifunctional epoxy resin YDCN-700-10 available from Tohto Kasei Co., Ltd., 6 g of MARPROOF G-0250SP available from NOF Corporation and 3 g of JER's 828 in 40 g of propylene glycol monomethyl acetate (PMA) was used instead of 100 g of the multifunctional partially-acrylated epoxy resin of cresol novolak type (Kagawa Chemical's ENA-4Y-1) of Example 1, and the photoradical polymerization initiator was not used.

Comparative Example 2

Predetermined optical waveguide patterns (including conductor patterns each having width/pitch (L/S) of 50 μm/200 μm for evaluation of adhesiveness and optical waveguide loss, and a pattern having L/S of 20 μm/20 μm for evaluation of patternability) were produced in substantially the same manner as in Example 1, except that a multifunctional fully-acrylated epoxy resin of cresol novolak type (Kagawa Chemical's ENA-4Y-4 having an epoxy group/acrylate group number ratio of 0:100 based on a total weight of photosensitive substituent groups defined as 100) was used instead of the multifunctional partially-acrylated epoxy resin of cresol novolak type (Kagawa Chemical's ENA-4Y-1) of Example 1, and the photoradical polymerization initiator was not used.

The optical waveguide patterns (samples) thus produced were evaluated for the following properties by the following evaluation methods. The results of the evaluation are shown below together with the weight-based proportions of the blended components in Table 1.

<Adhesiveness>

The optical waveguide pattern (the conductor pattern having width/pitch (L/S) of 50 μm/200 μm for evaluation of adhesiveness) was observed by means of an optical microscope after the developing/drying step so as to be checked for easy separation of the conductor (core) pattern formed on the 15-μm thick photo-cured aliphatic epoxy resin film. The results of the observation were evaluated based on the following criteria:

◯: The core pattern formed on the entire surface of the sample remained intact (achieving intended adhesiveness);

Δ: The core pattern formed on the entire surface of the sample was partly separated or lost (suffering from variations in adhesiveness); and x: The core pattern formed on the entire surface of the sample was completely separated (failing to achieve the intended adhesiveness).

[Patternability]

The optical waveguide pattern was observed in the same manner as for the evaluation of the adhesiveness by means of an optical microscope after the developing/drying step so as to be checked if the optical waveguide pattern was properly formed as having width/pitch (L/S) of 20 μm/20 μm. The results of the observation were evaluated based on the following criteria:

◯: The pattern (L/S of 20 μm/20 μm) of the sample was fully resolved (achieving intended resolution);

Δ: The pattern (L/S of 20 μm/20 μm) of the sample was partly stringy and collapsed (suffering from variations in patternability); and 0x: The pattern (L/S of 20 μm/20 μm) of the sample was completely collapsed (failing to achieve the intended resolution).

[Optical Waveguide Loss]

The transmission loss (dB/5 cm) per 5 cm of the optical waveguide pattern (the conductor pattern having width/pitch (L/S) of 50 μm/200 μm for evaluation of optical waveguide loss) was measured at a wavelength of 850 nm. A sample having an optical waveguide loss of less than 1.0 dB/5 cm was rated as acceptable.

waveguide loss of less than 1.0 dB/5 cm. Therefore, the inventive examples each provided a highly reliable optical waveguide. The optical waveguide patterns of the inventive examples and the comparative examples were free from tackiness.

In contrast, the optical waveguide pattern of Comparative Example 1 produced by using the epoxy resin was rated as excellent in adhesiveness and patternability, but was poorer in optical waveguide characteristic with a higher optical waveguide loss on the order of 2.5 dB/5 cm. The optical waveguide pattern of Comparative Example 2 produced by using the acrylate resin was completely separated, so that the optical waveguide loss was unmeasurable.

The resin composition for the optical waveguide is useful as the core material of the optical waveguide. The optical waveguide produced by using the resin composition is usable for a signal transmission circuit to be provided in a hinge portion or a slidable portion of a mobile device such as a foldable mobile phone.

Although specific forms of embodiments of the instant invention have been described above in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. An optical waveguide, comprising:
   a substrate;
   a cladding layer provided on the substrate; and
   a core portion provided on the cladding layer for transmission of an optical signal;
   wherein the core portion is formed from a resin composition comprising:
   (A) a multifunctional partially-acrylated epoxy resin having a structural unit represented by the following general formula (1) as a main component,
   wherein epoxy groups and (meth)acrylate groups are present as photosensitive substituent groups in a number

TABLE 1

| Formulation (on weight basis)[1] | Example 1 | Example 2 | Example 3 | Comparative Example 1 | Comparative Example 2 |
|---|---|---|---|---|---|
| Resin component | | | | | |
| Material name | ENA-4Y-1 | ENA-4Y-2 | ENA-4Y-3 | YDCN-700-10 | ENA-4Y-4 |
| Epoxy group/acrylate group number ratio | 50/50 | 60/40 | 40/60 | 100/0 | 0/100 |
| Proportion (on solid basis) | 100 | 100 | 100 | 100 | 100 |
| Photopolymerization initiator | | | | | |
| IRGACURE 819 | 1 | 1 | 1 | — | 1 |
| IRGACURE 184 | 5 | 5 | 5 | — | 5 |
| CPI-200K (on solid basis) | 1 (0.5) | 1 (0.5) | 1 (0.5) | 4 (2) | — |
| Adhesiveness | ◯ | ◯ | ◯ | ◯ | x (completely separated) |
| Patternability | ◯ | ◯ | ◯ | ◯ | x (completely separated) |
| Optical waveguide loss (dB/5 cm) | 0.5 | 0.51 | 0.53 | 2.5 | —[2] |

[1] The proportions of the respective components are expressed in parts by weight based on 100 parts by weight of the resin component (on a solid basis).
[2] The optical waveguide loss was unmeasurable because of complete separation of the optical waveguide pattern.

The above results indicate that the optical waveguide patterns of the inventive examples each produced by using the multifunctional partially-acrylated epoxy resin having the specific structural unit were rated as excellent or acceptable in adhesiveness and patternability, and each had an optical ratio of 40:60 to 60:40 based on a total number of 100 in the multifunctional partially-acrylated epoxy resin (A), wherein the total number of 100 represents 100% of a total of epoxy groups and (meth)acrylate groups present in the multifunctional partially-acrylated epoxy resin:

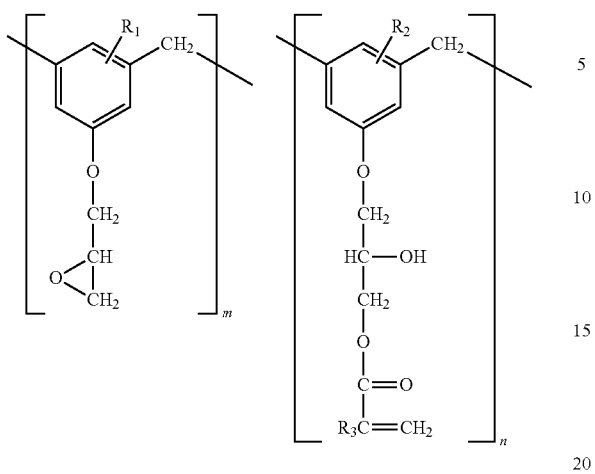

wherein $R_1$ and $R_2$, which may be the same or different, are each a hydrogen atom or a methyl group, wherein $R_3$ is a hydrogen atom or a methyl group, and wherein in the entirety of the multifunctional partially-acrylated epoxy resin (A), $m+n=1$, $m=0.40$-$0.60$ and $n=0.60$-$0.40$; and (B) a photopolymerization initiator system as a curing component comprising both a photoradical polymerization initiator and a photoacid generator.

2. The optical waveguide according to claim 1, wherein the photoradical polymerization initiator at least one selected from the group consisting of benzoins, benzoin alkyl ethers, acetophenones, aminoacetophenones, anthraquinones, thioxanthones, ketals, benzophenones, xanthones and phosphine oxides, and wherein the photoacid generator is at least one selected from the group consisting of aromatic diazonium salts, aromatic sulfonium salts, aromatic iodonium salts, aromatic sulfoxonium salts, metallocene compounds and iron arene compounds.

3. An optical waveguide production method for producing an optical waveguide including a substrate, a cladding layer provided on the substrate, and a core portion provided on the cladding layer for transmission of an optical signal, the method comprising the steps of:

forming the cladding layer on the substrate; and forming the core portion on the cladding layer from a resin composition comprising:

(A) a multifunctional partially-acrylated epoxy resin having a structural unit represented by the following general formula (1) as a main component, wherein epoxy groups and (meth)acrylate groups are present as photosensitive substituent groups in a number ratio of 40:60 to 60:40 based on a total number of 100 in the multifunctional partially-acrylated epoxy resin (A), wherein the total number of 100 represents 100% of a total of epoxy groups and (meth)acrylate groups present in the multifunctional partially-acrylated epoxy resin:

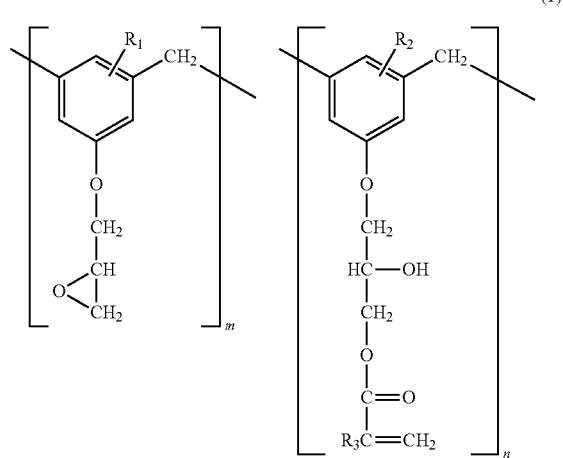

wherein $R_1$ and $R_2$, which may be the same or different, are each a hydrogen atom or a methyl group, wherein $R_3$ is a hydrogen atom or a methyl group, and wherein in the entirety of the multifunctional partially-acrylated epoxy resin (A), $m+n=1$, $m=0.40$-$0.60$ and $n=0.60$-$0.40$; and (B) a photopolymerization initiator system as a curing component comprising both a photoradical polymerization initiator and a photoacid generator.

4. The production method according to claim 3, wherein the step of forming the cladding layer on the substrate and the step of forming the core portion on the cladding layer are continuously performed through a roll-to-roll process by paying out a substrate web from a roll and rewinding the substrate web after completion of the step of forming the cladding layer on the substrate and the step of forming the core portion on the cladding layer.

5. The production method according to claim 3, wherein the photoradical polymerization initiator at least one selected from the group consisting of benzoins, benzoin alkyl ethers, acetophenones, aminoacetophenones, anthraquinones, thioxanthones, ketals, benzophenones, xanthones and phosphine oxides, and wherein the photoacid generator is at least one selected from the group consisting of aromatic diazonium salts, aromatic sulfonium salts, aromatic iodonium salts, aromatic sulfoxonium salts, metallocene compounds and iron arene compounds.

* * * * *